United States Patent
Kosaka et al.

(10) Patent No.: US 12,424,816 B2
(45) Date of Patent: Sep. 23, 2025

(54) SEMICONDUCTOR LASER DEVICE

(71) Applicant: Mitsubishi Electric Corporation, Tokyo (JP)

(72) Inventors: Naoki Kosaka, Tokyo (JP); Ayumi Fuchida, Tokyo (JP); Naoki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 885 days.

(21) Appl. No.: 17/636,313

(22) PCT Filed: Nov. 28, 2019

(86) PCT No.: PCT/JP2019/046492
§ 371 (c)(1),
(2) Date: Feb. 17, 2022

(87) PCT Pub. No.: WO2021/106127
PCT Pub. Date: Jun. 3, 2021

(65) Prior Publication Data
US 2022/0285905 A1      Sep. 8, 2022

(51) Int. Cl.
*H01S 5/02326* (2021.01)
*H01S 5/00* (2006.01)
*H01S 5/0231* (2021.01)

(52) U.S. Cl.
CPC .......... *H01S 5/0231* (2021.01); *H01S 5/0071* (2013.01)

(58) Field of Classification Search
CPC .. H01S 5/02255; H01S 5/0231; H01S 5/0262; H01S 5/0264; H01S 5/02326; H01S 5/02253; H01S 5/0683
See application file for complete search history.

(56) References Cited

U.S. PATENT DOCUMENTS

| | | | |
|---|---|---|---|
| 6,687,272 B2* | 2/2004 | Hamasaki | H01S 5/02255 372/50.1 |
| 2005/0196112 A1 | 9/2005 | Takagi | |
| 2006/0215726 A1 | 9/2006 | Alduino et al. | |
| 2007/0138490 A1* | 6/2007 | Nagai | H01S 5/0683 257/94 |

FOREIGN PATENT DOCUMENTS

| | | |
|---|---|---|
| JP | H108-116127 A | 5/1996 |
| JP | 2005-260223 A | 9/2005 |
| JP | 2008-535259 A | 8/2008 |

OTHER PUBLICATIONS

International Search Report issued in PCT/JP2019/046492; mailed Feb. 10, 2020.

* cited by examiner

*Primary Examiner* — Xinning (Tom) Niu
*Assistant Examiner* — Delma R Forde
(74) *Attorney, Agent, or Firm* — Studebaker Brackett PLLC

(57) ABSTRACT

A semiconductor laser device disclosed in this application is characterized; wherein one of the reflective surface and the secondary reflective surface is constituted by a dielectric multi-layer film that is formed on a PD chip for measuring a light quantity of the laser light; and wherein an inclination angle of the reflective surface is set to a value obtained by subtraction of a value that is less than an inclination angle of beam center, from 45 degrees, while an inclination angle of the secondary reflective surface is set to a value obtained by subtraction of a value that is more than the inclination angle of beam center, from 45 degrees.

20 Claims, 4 Drawing Sheets

SEMICONDUCTOR LASER DEVICE

TECHNICAL FIELD

The present application relates to a semiconductor laser device.

BACKGROUND ART

In a semiconductor laser device for use in communications, when a photodiode chip (PD chip) for monitoring an output from a semiconductor laser chip (LD chip) is positioned on the rear-end side of the LD chip, because a ratio between the forward output of light and the rearward output of light is unstable, it is difficult to make highly accurate control. Thus, such a semiconductor laser device is proposed in which a photodiode chip (PD chip) for monitoring the forward output of light is inclined at 45 degrees relative to the stem top face to thereby cause the forward light emitted from the LD chip to be bent in a direction perpendicular to that face (see, for example, Patent Documents 1 and 2).

Further, such a structure is disclosed in which, in order to reduce optical coupling loss, laser light is bent by a curved or non-planar light reflector so that it is converged on an optical fiber (see, for example, Patent Document 3).

CITATION LIST

Patent Document

Patent Document 1: Japanese Patent Application Laid-open No. H08-116127 (Paragraphs 0022 to 0027; FIG. 1 to FIG. 4)

Patent Document 2: Japanese Patent Application Laid-open No. 2005-260223 (Paragraphs 0016 to 0030; FIG. 1 to FIG. 2)

Patent Document 3: Japanese Translation of PCT International Application Publication No. 2008-535259 (Paragraphs 0019 to 0021; FIG. 4)

SUMMARY OF THE INVENTION

Problems to be Solved by the Invention

In this regard, laser light emitted from the LD chip is spreading and thus, depending on its angle from the optical axis, the laser-light incident angle on the reflective surface varies, causing dispersion in reflectance. According to the techniques disclosed in the respective Documents described above, however, no consideration is paid to such dispersion in reflectance, and as a result, there is a risk that the intensity distribution of laser light may be deformed and thus communication quality may be degraded.

This application discloses a technique for solving a problem as described above, and an object thereof is to achieve a semiconductor laser device which can suppress degradation in communication quality and reduction in output of light.

Means for Solving the Problems

A semiconductor laser device disclosed in this application is characterized by comprising: a stem having a mounting surface which is located to be opposite to and spaced apart from an emission port; a semiconductor laser light source which is disposed so as to have beam components whose beam center is directed toward the mounting surface; a reflective surface for reflecting laser light incident from the semiconductor laser light source toward the emission port; and a secondary reflective surface for reflecting laser light incident from the semiconductor laser light source toward the emission port, which is continuous with an end portion of said reflective surface on its side nearer to the semiconductor laser light source;

wherein one of said reflective surface and said secondary reflective surface is constituted by a dielectric multi-layer film that is formed on a photodiode for measuring a light quantity of the laser light; and wherein, in a plane perpendicular to the mounting surface and including the beam center, when an inclination angle of the beam center relative to the mounting surface is defined as a, an inclination angle R of said reflective surface is set to a value obtained by subtraction of a value that is less than α, from 45 degrees, while an inclination angle γ of said secondary reflective surface is set to a value obtained by subtraction of a value that is more than α, from 45 degrees.

Effect of the Invention

According to the semiconductor laser device disclosed in this application, since two-stage reflective surfaces with different inclination angles are used, dispersion in incident angle is reduced. Thus, it is possible to provide a semiconductor laser device which can suppress degradation in communication quality and reduction in output of light.

MODES FOR CARRYING OUT THE INVENTION

Embodiment 1

Figure 1A:
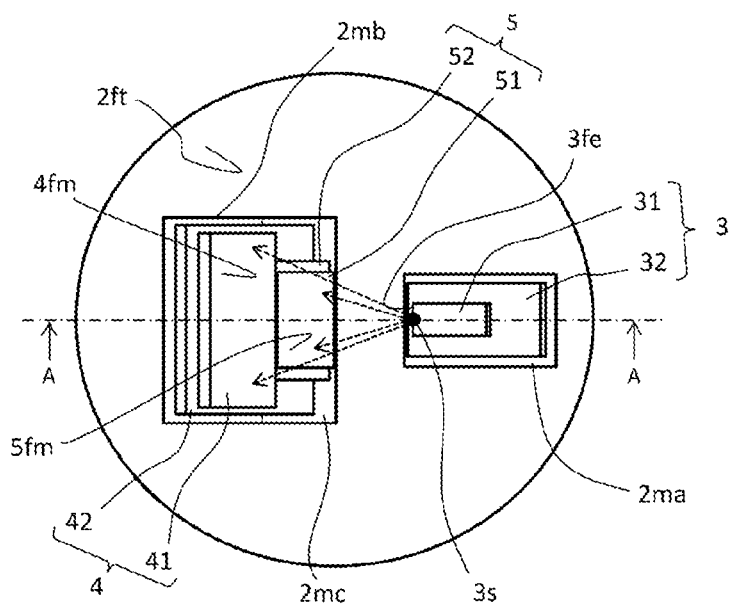
FIG. 1A and FIG. 1B are respectively a plan view and a sectional view of a semiconductor laser device according to Embodiment 1.
Figure 1B:
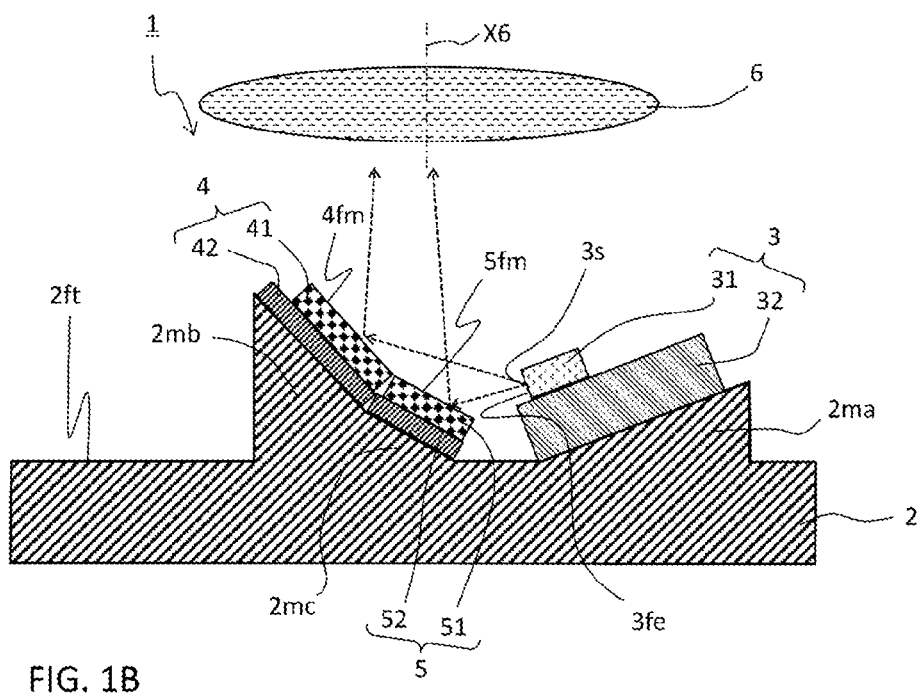
Figure 2:
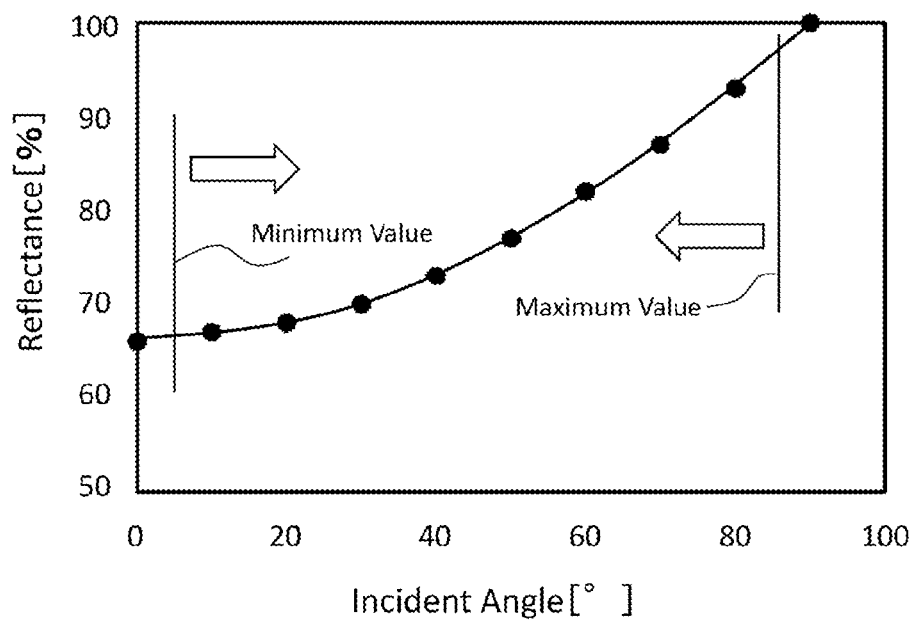
FIG. 2 is a diagram in graph form showing incident-angle dependency of laser light reflectance on a surface of a PD chip.
Figure 3:
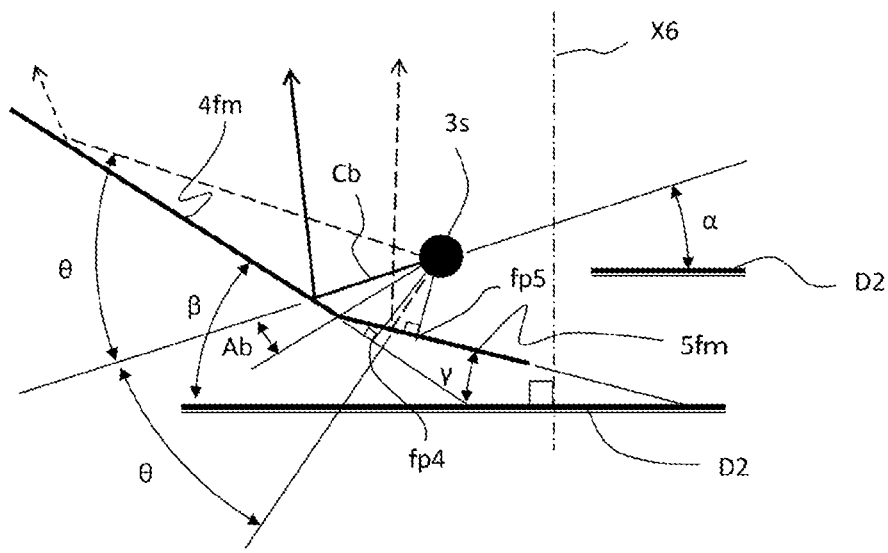
FIG. 3 is a diagram showing angular relationships between laser light and reflective surfaces in the semiconductor laser device according to Embodiment 1.

FIG. 1A, FIG. 1B to FIG. 3 serve for explaining a configuration of a semiconductor device according to Embodiment 1 and operations thereof, in which FIG. 1A shows a plan view of the semiconductor device as viewed from the side of its lens, and FIG. 1B shows a sectional view in a plane perpendicular to a stem top face (mounting surface) of the semiconductor laser device and including a beam center of laser light, taken by cutting along an A-A line in FIG. 1A. Further, FIG. 2 is a diagram in graph form showing incident-angle dependency of laser light reflectance on a surface of a PD chip. Furthermore, FIG. 3 is a diagram showing angular relationships between laser light and reflective surfaces, in a positional situation corresponding to FIG. 1B.

The semiconductor laser device 1 according to each of Embodiments in this application has, as shown in FIG. 1A and FIG. 1B, an LD chip 31 for oscillating laser light and a PD chip 41 for monitoring an intensity of forward light emitted from the LD chip 31 and reflecting the forward light toward a lens 6. The lens 6, which is an emission port of the semiconductor laser device 1, is located to be opposite to and spaced apart from a mounting surface 2ft of a stem 2 on which the LD chip 31 and the PD chip 41 are mounted, with its optical axis X6 being perpendicular to that surface.

Furthermore, on the stem 2 and between the PD chip 41 and the LD chip 31, a secondary reflection portion 5 is disposed which has a secondary reflective surface 5fm which is continuous with a reflective surface 4fm of the PD chip 41 at its side nearer to the LD chip 31. The LD chip 31 is disposed to be inclined relative to the mounting surface 2ft so as to emit laser light so that its beam center Cb (FIG. 3) is directed toward the mounting surface 2ft, and the laser light emitted from a front-end face 3fe is designed to be reflected upward by the secondary reflective surface 5fm and the reflective surface 4fm toward the lens 6.

Accordingly, in the stem 2, there are an inclined rest 2ma for disposing the LD chip 31, an inclined rest 2mb for disposing the PD chip 41 and an inclined rest 2mc for disposing the secondary reflection portion 5, which are provided with their respective inclination angles having relationships therebetween to be described later. The LD chip 31 and the PD chip 41 are mounted on the inclined rest 2ma and the inclined rest 2mb through an LD sub-mount 32 and a PD sub-mount 42, respectively. Further, the secondary reflective surface 5fm is established such that the PD chip 51 is mounted on the inclined rest 2mc through a PD sub-mount 52.

It is noted that the LD chip 31 and the LD sub-mount 32 are referred to collectively as a semiconductor laser light source 3, and the PD chip 41 and the PD sub-mount 42 are referred to collectively as a reflection portion 4. Likewise, the PD chip 51 and the PD sub-mount 52 are referred to collectively as the secondary reflection portion 5. It is further noted that the semiconductor laser device 1 is provided with other members than the illustrated members, for example, circuit members and the like; however, in this application, it is described only based on the optical elements extracted therefrom.

The PD chip 41 functions as a monitor for measuring the intensity of the laser light emitted from the LD chip 31, and establishes using a dielectric multi-layer film, the reflective surface 4fm for reflecting the laser light. The dielectric multi-layer film has a structure in which respective materials with different refractive indexes are stacked into a layered structure, which is, for example, a film of Si and $SiO_2$ stacked into a multi-layered structure by which the laser light can be reflected efficiently. Note that the light reflectivity of the dielectric multi-layer film can be changed by controlling the number of layers. This makes it possible for the PD chip 41 to take therein a necessary part of the laser light to measure the intensity thereof. Further, like the PD chip 41, the PD chip 51 in the secondary reflection portion 51 establishes using a dielectric multi-layer film, the secondary reflective surface 5fm for reflecting the laser light. Note that, this use of the dielectric multi-layer film is not limitative, and a reflective metal film or the like, so long as it can be formed to allow a part of the light to pass therethrough, may be used for constituting that reflective surface so as to reflect the laser light.

It should be noted that the semiconductor laser device 1 according to each of Embodiments in this application is characterized in that an inclination angle $\alpha$ of the semiconductor laser light source 3, an inclination angle $\beta$ of the reflective surface 4fm and an inclination angle $\gamma$ of the secondary reflective surface 5fm, relative to the mounting surface 2ft, are set according to the spread of the laser light (spread angle $\theta$). Prior to describing the details of this characteristic, description will be made about reflections in a usual semiconductor laser device as disclosed in Patent Document 1 or 2.

For example, in the case where the spread angle $\theta$ from the beam center Cb is zero degree, namely, in the case of parallel light, if the LD chip is disposed in parallel to the stem top face and the light is reflected upward toward the lens only by using a reflective surface inclined at 45 degrees, incident angles are all 45 degrees. Namely, in the case of handling parallel light only, it suffices to reflect the laser light only by using a reflective surface having an inclination angle of 45 degrees relative to the stem top face, that is, 135 degrees (180−45 degrees) relative to the laser light, as described in Patent Document 1 or 2.

However, laser light from the LD chip is actually emitted with a spread of $\pm\theta$ from the beam center Cb. On this occasion, for example, incident angles of the light spreading toward a side of the beam center Cb nearer to the lens are each larger than an incident angle of the light at the beam center Cb, and incident angles of the light spreading toward a side of the beam center Cb nearer to the stem are each smaller than the incident angle of the light at the beam center Cb. Namely, regarding the light spreading toward the stem side with respect to the beam center Cb, the incident angle at the outermost end has a minimum value of $(45-\theta)$, and regarding the light spreading toward the lens side with respect to the beam center Cb, the incident angle at the outermost end has a maximum value of $(45+\theta)$.

Accordingly, in the case of using, for example, the LD chip with a spread angle $\theta$ of 40 degrees, the incident angle varies from 5 to 85 degrees, causing a difference of 80 degrees $(=2\theta)$. Thus, as shown in FIG. 2, the reflectance spreads in its distribution from a little less than 70% up to nearly 95%, so that there is a risk that the intensity distribution of laser light is deformed and thus communication quality may be degraded. For dealing therewith, for example, the LD chip is inclined downward by 20 degrees ($\alpha=20$) and, in order to compensate a directional change of the reflected light toward the lens 6 caused by that inclination, an inclination angle $\beta$ of the PD chip is decreased by half of $\alpha$ (=10 degrees) from 45 degrees ($\beta=45-\alpha/2$).

As a result, the inclination angle of the PD chip relative to the beam center Cb becomes smaller by 10 degrees ($=\alpha-\beta$) than 135 degrees. Accordingly, the maximum value of the geometric incident angle is given as 75 degrees ($=45+\theta-\alpha+\beta$), the minimum value thereof is given as −5 degrees ($=45-\theta-\alpha+\beta$), and the minimum value thereof taken into account dispersion in reflectance is given as zero degrees, so that the difference is narrowed to 75 degrees ($=75-0$). This means, however, that the portion with an incident angle of zero degrees or less, goes to a side lower than the original position of the LD chip and thus does not go toward the lens, so that the availability of laser light is reduced.

In contrast, in the semiconductor laser device 1 of this application, in addition to the LD chip 31 and the reflective surface 4fm that are in the above-described inclined relation, the secondary reflective surface 5fm is provided which is continuous with the reflective surface 4fm and has an inclination angle smaller than that of the reflective surface 4fm. Particularly, as shown in FIG. 3, the inclination angle β of the reflective surface 4fm of the PD chip 41, relative to a direction D2 parallel to the mounting surface 2ft of the stem 2, is set to the aforementioned degrees of 45−α/2, and the inclination angle γ of the secondary reflective surface 5fm is set smaller than the inclination angle β so that an angle thereof made with the beam center Cb is larger than 135 degrees. Namely, the angle of the reflective surface 4fm relative to the beam center Cb is set smaller than 135 degrees and the angle of the secondary reflective surface 5fm relative to the beam center Cb is set larger than 135 degrees.

More specifically, the inclination angle γ is set to 45−(α+θ)/2 degrees, so that, as will be described later, the reflective surface 4fm can be irradiated with beams in all over the region above the beam center Cb in FIG. 3 and beams in the region within θ/2 degrees below the beam center Cb. Note that when such a definition of γ=45−(α+θ)/2 is given, the condition for making the angle of the secondary reflective surface 5fm relative to the beam center Cb larger than 135 degrees, is given as α<0.

For example, with respect to the condition of θ=40 degrees, when α is set to the aforementioned 20 degrees, β=35 degrees and γ=15 degrees are given, so that the angle of the reflective surface 4fm relative to the beam center Cb is 125 degrees and the angle of the secondary reflective surface 5fm relative to the beam center Cb is 145 degrees. Namely, the angle of the reflective surface 4fm relative to the beam center Cb becomes smaller by 10 degrees than 135 degrees, and the angle of the secondary reflective surface 5fm relative to the beam center Cb becomes larger by 10 degrees than 135 degrees.

When the reduction (difference) in the angle of the reflective surface 4fm relative to the beam center Cb from 135 degrees is defined as $\Delta_4$, the maximum value of the incident angle on the reflective surface 4fm is given as 75 degrees ($=45+\theta-\Delta_4$) and is thus smaller than that (85 degrees) in the case where the inclination is simply at the aforementioned 45 degrees. On the other hand, when the increase (difference) in the angle of the secondary reflective surface 5fm relative to the beam center Cb from 135 degrees is defined as $\Delta_5$, the minimum value of the incident angle on the secondary reflective surface 5fm is given as 15 degrees ($=45-\theta-\Delta_5$) and thus the difference is reduced to 70 degrees. On this occasion, with respect to the reflective surface 4fm, the beam portion which has an incident angle of 15 degrees, that is equal to the minimum value, is that inclined downward by 20 degrees ($=\theta/2$) from the beam center Cb.

Accordingly, when an angle corresponding to the portion inclined downward by 20 degrees is referred to as a boundary angle Ab, if a boundary at which the secondary reflective surface 5fm is continuous is set at the boundary angle Ab, it is possible to keep the minimum value of the incident angle equal to or more than 15 degrees. The incident angle on the secondary reflective surface 5fm at the boundary angle Ab is 35 degrees ($=45-Ab+\Delta_5$), and the incident angle on the reflective surface 4fm varies from 75 degrees to 15 degrees over a range from its end portion nearer to the lens 6 to its boundary portion with the secondary reflective surface 5fm. Likewise, the incident angle on the secondary surface 5fm varies from 35 degrees to 15 degrees over a range from its boundary portion with the reflective surface 4fm to its end portion nearer to the LD chip 31. Namely, the difference in incident angle is reduced to 60 degrees and thus dispersion in reflectance is suppressed. This makes it possible to uniform the intensity distribution of laser light, to thereby ensure high communication quality.

It is noted that $\Delta_4=\alpha/2$ is given according to the relationship represented by $\beta=45-1/2\alpha$, so that the maximum value of the incident angle on the reflective surface 4fm is given as 45+θ−α/2. Further, since $\Delta_5=45-\alpha-\gamma$ is given, the minimum value of the incident angle on the secondary reflective surface 5fm is given as 90−θ−α−γ. Therefore, the boundary angle Ab is given as θ+γ+α/2−45 and the incident angle on the secondary reflective surface 5fm at the boundary angle Ab is given as 135−θ−2γ−3/2α.

At that time, with respect to the reflective surface 4fm, laser light is reflected only at a side nearer to the lens 6 than a foot fp4 of a perpendicular line that is drawn from an emitting point 3s. Likewise, with respect also to the reflective surface 5fm, laser light is reflected only at a side nearer to the lens 6 than a foot fp5 of a perpendicular line that is drawn from the emitting point 3s. Thus, it is also possible to suppress components not directed to the lens 6-side, to thereby ensure the availability of laser light. This comes into effect in any combination of α and θ that satisfies α<θ, by setting the boundary between the reflective surface 4fm and the secondary reflective surface 5fm at an adequate position.

It is noted that the aforementioned boundary angle Ab defines a boundary for keeping the minimum value of the incident angle on the reflective surface 4fm equal to or more than the minimum value of the incident angle on the reflective surface 5fm. Thus, when the boundary is set at an angle smaller than the boundary angle Ab, the minimum value of the incident angle on the reflective surface 4fm increases. In that case, however, the quantity of the light that can be monitored by the PD chip 41 decreases. Thus, the boundary may be set appropriately according to the order of importance.

On the other hand, the minimum value increases by an angle corresponding to $\Delta_5$ that is an increase in the angle made by the beam center Cb and the secondary reflective surface 5fm, from 135 degrees. Thus, the increase $\Delta_5$ from 135 degrees may be set to a value that exceeds zero, without being restricted by the above definition of $(\gamma=45-(\alpha+\theta)/2)$. In that case, however, the boundary angle Ab provided with an incident position on the reflective surface 4fm, becomes smaller by 0.5 degree from e when α becomes larger by 1 degree, while it becomes smaller by 1 degree when $\Delta_5$ becomes larger similarly by 1 degree, so that the incident position becomes closer to that of the beam center Cb. Namely, Ab=θ−$\Delta_5$−α/2 is given.

As described above, the secondary reflection portion 5 is formed using the PD sub-mount 52 that is less expensive than an optical mirror, and the PD chip 51, so that it is possible to manufacture the semiconductor laser device 1 at low cost. Furthermore, when the secondary reflection portion 5 is also used as a monitor for the light from the LD chip 31, it is possible to employ a large monitoring current for detecting the output of light.

Embodiment 2

Figure 4:
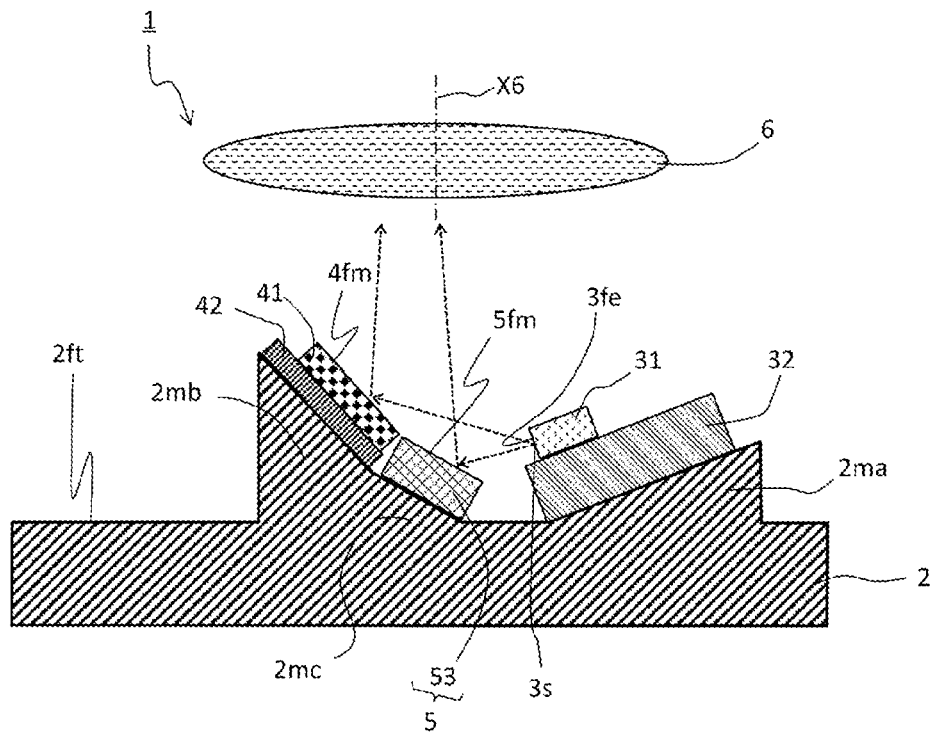
FIG. 4 is a sectional view of a semiconductor laser device according to Embodiment 2.

In the foregoing Embodiment 1, a case has been described where the secondary reflection portion is formed using a PD chip; however, this is not limitative. In Embodiment 2, a case will be described where a secondary reflection portion is formed using a reflection member based on a refractive index difference. FIG. 4 serves for explaining a configuration of a semiconductor laser device according to Embodiment 2, and is a sectional view corresponding to FIG. 1B used for the description in Embodiment 1. Note that, in each of the semiconductor laser devices according to Embodiment 2 and according to Embodiment 3 to be described later, its configuration other than the secondary reflection portion is the same as that described in Embodiment 1, so that FIG.

2 and FIG. 3 used in Embodiment 1 will be also employed and description of the same parts will be omitted.

As shown in FIG. 4, in the semiconductor laser device 1 according to Embodiment 2, instead of the PD chip 51 and the PD sub-mount 52 described in Embodiment 1, a reflection member 53 based on a refractive index difference is mounted on the inclined rest 2*mc* to thereby form a secondary reflection portion 5. Even in this case, it is possible for the PD chip 41 to take therein a necessary part of the laser light. Further, the reflection member 53 only has to be able to reflect laser light and may be a prism mirror. Meanwhile, when it is a so-called mirror component having a highly reflective film formed on its surface, it is possible to set its angle without taking into account the minimum value of the incident angle on the secondary reflective surface 5*fm*, as in Embodiment 3 to be described later.

It is noted that in the semiconductor laser device 1 according to Embodiment 2, the secondary reflection portion 5 has no function of measuring the light intensity. Thus, what is important is the rate of laser light incident on the reflective surface 4*fm*, namely, how the boundary is set. Accordingly, by giving the definition of, for example, $\gamma=45-(\alpha+\theta)/2$, the boundary angle Ab is fixed to be matched with a position at an angle of $\theta/2$ from the beam center Cb toward the stem 2. Thus, the monitorable emission range is firmly established, so that it is possible to stably perform monitoring of the light intensity, namely, controlling thereof.

It is further noted that the reflection member 53 may instead be placed on the inclined rest 2*mb* while the PD chip 41 may instead be placed on the inclined rest 2*mc*-side. Even in that case, it is desired that the boundary angle Ab be determined adequately to thereby set the monitorable emission range.

Also by the semiconductor laser device 1 according to Embodiment 2, like in Embodiment 1, the difference in incident angle is reduced and thus dispersion in reflectance is suppressed, so that it is possible to uniform the intensity distribution of laser light, to thereby ensure high communication quality.

Embodiment 3

Figure 5:
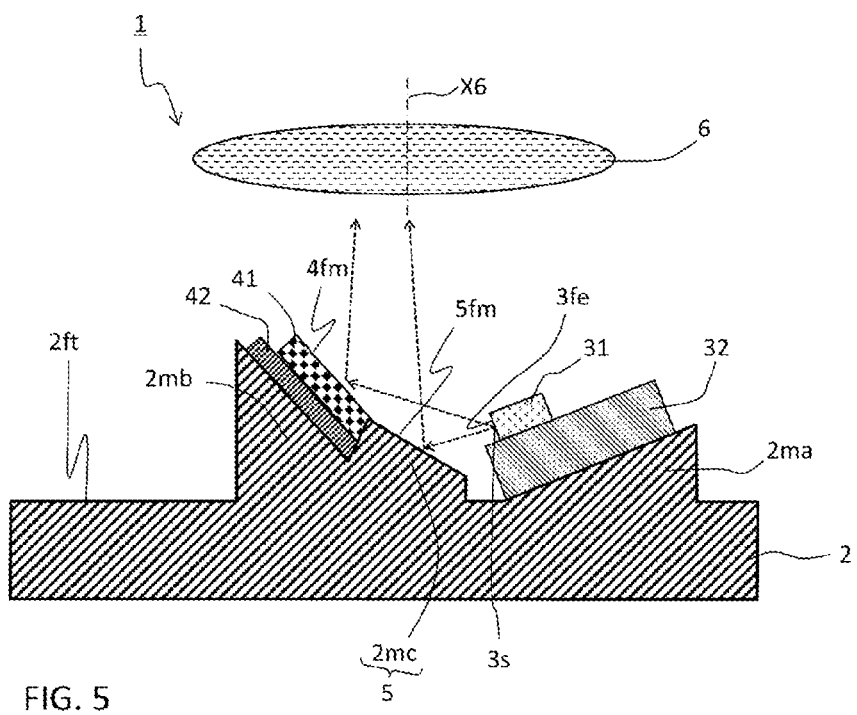
FIG. 5 is a sectional view of a semiconductor laser device according to Embodiment 3.

In the foregoing Embodiment 1 or 2, a case has been described where a PD chip or a reflection member is mounted on an inclined rest to thereby form the secondary reflection portion; however, this is not limitative. In Embodiment 3, a case will be described where an inclined rest is finished to have a mirror surface to thereby form a secondary reflection portion by itself. FIG. 5 serves for explaining a configuration of a semiconductor laser device according to Embodiment 3, and is a sectional view corresponding to FIG. 1B used for the description in Embodiment 1.

As shown in FIG. 5, in the semiconductor laser device 1 according to Embodiment 3, the PD chip 51 and the PD sub-mount 52 described in Embodiment 1 are not used and, instead, the front surface of the inclined rest 2*mc* is finished into a mirror surface to thereby form a secondary reflection portion 5. Even in this case, it is possible for the PD chip 41 to take therein a necessary part of the laser light. Furthermore, with respect to the inclined rest 2*mc*, its protrusion amount from the mounting surface 2*ft* is made larger than that in Embodiment 1 or 2 so that its surface (secondary reflective surface 5*fm*) is continuous with the reflective surface 4*fm*, and thus it is more protruded than the inclined rest 2*mb*.

The mirror surface may be created by such a step in which the surface of the stem 2 is subjected to plating with gold, followed by pressing, and may be created by forming another reflective metal film. The reflectance on the surface of the PD chip 41 is 70% or more as shown in FIG. 2, while a reflectance of 100% can be achieved on such a surface of the stem 2. Further, according to the structure here, it is not required to use like in Embodiment 1 or 2, the PD chip 51 and the PD sub-mount 52, or the reflection member 53, as the secondary reflection portion 5, so that it is possible to achieve cost reduction. Further, in the manufacturing steps, it is possible to make positioning of the PD sub-mount 42 and the PD chip 41 which establish the reflective surface 4*fm*, by abutting them against a wall surface of the inclined rest 2*mc*. Thus, positioning of the PD sub-mount 42 and the PD chip 41 becomes easier, so that the productivity is improved.

It is noted that, also in Embodiment 3, the secondary reflection portion 5 has no function of measuring the light intensity like in Embodiment 2. Thus, what is important is the rate of laser light incident on the reflective surface 4*fm*, namely, how the boundary angle Ab is set. Accordingly, by giving the definition of, for example, $\gamma=45-(\alpha+\theta)/2$, the boundary angle Ab is fixed to be matched with a position at an angle of $\theta/2$ from the beam center Cb toward the stem 2. Thus, the monitorable emission range is firmly established, so that it is possible to stably perform monitoring of the light intensity, namely, controlling thereof.

On the other hand, since a reflectance of 100% is achieved on the mirror-finished secondary reflective surface 5*fm* as described above, it is unnecessary to decrease the maximum value of the incident angle on the reflective surface 4*fm*. Thus, it suffices to only focus on how to increase the minimum value and how to set the incident beam range. Further, with respect to the secondary reflective surface 5*fm*, it is unnecessary to take into account dispersion in incident angle, so that it suffices to establish only such a condition that its end section extending within the angle $\theta$ downward from the beam center Cb of the laser light, is positioned above the foot fp5 of the perpendicular line from the emitting point 3*s*.

Also by the semiconductor laser device 1 according to Embodiment 3, like in Embodiments 1 and 2, the difference in incident angle is reduced and thus dispersion in reflectance is suppressed, so that it is possible to uniform the intensity distribution of laser light, to thereby ensure high communication quality.

Embodiment 4

Figure 6A:
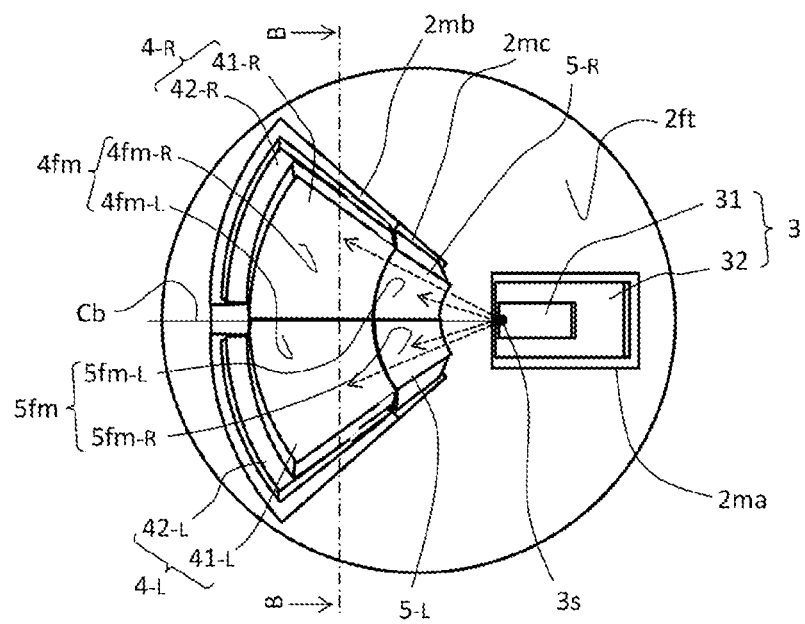
FIG. 6A and FIG. 6B are respectively a plan view and a sectional view of a semiconductor laser device according to Embodiment 3.
Figure 6B:
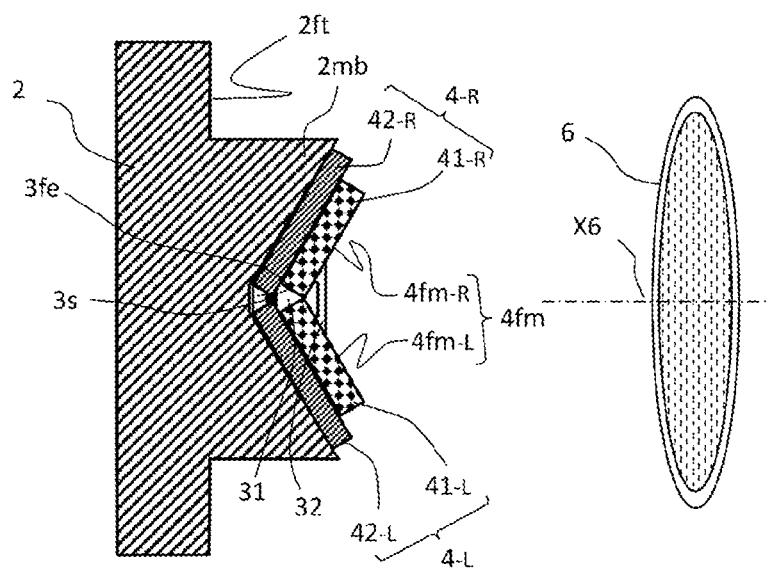

In each of the foregoing Embodiments 1 to 3, description has been made on an arrangement example of the reflective surfaces in a plane perpendicular to the mounting surface and including the beam center, whereas, in Embodiment 4, description will be made on another arrangement example of the reflective surfaces on the mounting surface. FIG. 6A and FIG. 6B serves for explaining a configuration of a semiconductor laser device according to Embodiment 4, and FIG. 6A shows a plan view of the semiconductor laser device viewed from the side of its lens, and FIG. 6B shows a sectional view perpendicular to the mounting surface of the semiconductor laser device, taken by cutting along a B-B line in FIG. 6A. Note that how the reflective surfaces are arranged in a plane perpendicular to the mounting surface and including the beam center, will be described based on the case of Embodiment 1, and FIG. 2 and FIG. 3 used in Embodiment 1 will be also employed and description of the same parts will be omitted.

As shown in FIG. 6A and FIG. 6B, in the semiconductor laser device 1 according to Embodiment 4, a reflection portion 4 and a secondary reflection portion 5 are each disposed along a plane parallel to a mounting surface 2*ft* of a stem 2 and in a state divided into right and left portions across the beam center Cb, as represented by a right reflection portion 4$_{-R}$ and a left reflection portion 4$_{-L}$. Further, a left reflective surface 4*fm*$_{-L}$ and a left secondary reflective surface 5*fm*-L are located to be symmetrical to a right reflective surface 4*fm*$_{-R}$ and a right secondary reflective surface 5*fm*$_{-R}$, about a plane perpendicular to the mounting surface 2*ft* and including the beam center Cb, as a symmetry plane, and these surfaces are each inclined so as to go upward as it becomes more distant from the symmetry plane.

Namely, in addition to being inclined by the inclination angle α and the inclination angle β in the plane perpendicular to the mounting surface 2*ft* and including the beam center Cb that are previously described in Embodiments 1 to 3, the reflective surface 4*fm* and the secondary reflective surface 5*fm* are inclined also in a plane perpendicular to the beam center Cb so as to become higher as it becomes more distant from the beam center. As a result, as shown in FIG. 6B, when viewed from the side opposite to the front-end face 3*fe* of the LD chip 31, the reflective surface 4*fm* forms a V shape similarly to the unillustrated secondary reflective surface 5*fm*.

Since the reflective surface 4*fm* and the secondary reflective surface 5*fm* are each formed into a V shape as described above, it is possible to suppress the laser light after being incident from the semi-conductor laser light source 3, from spreading along the plane parallel to the mounting surface 2*ft* (in a vertical direction in FIG. 6A and FIG. 6B). As a result, the quantity of the laser light incident on the lens 6 increases, so that it is possible to suppress reduction in output of light.

It is noted that, for simplifying the description herein, FIG. 6A is provided with an illustration corresponding to the reflection member 53 described in Embodiment 2; however, this is not limitative, and the secondary reflection portion 5 may have a configuration described in Embodiment 1 or Embodiment 3.

It should be further noted that, in this application, a variety of exemplary embodiments and examples have been described; however, every characteristic, configuration or function that has been described in one or more embodiments, is not limited to being applied to a specific embodiment, and may be applied singularly or in any of various combinations thereof to another embodiment. Accordingly, an infinite number of modified examples that have been not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

For example, although the description has been made about cases where the lens 6 is provided as an emission port, the emission port is not limited thereto, and it is allowed to directly irradiate an end face of the optical fiber with the reflected light. Thus, the light only has to be radiated toward any emission port opposing the mounting surface 2*ft* of the stem 2. Further, the description has been made about cases where the semiconductor laser light source 3, the reflection portion 4 and the secondary reflection portion 5 are disposed on the inclined rests 2*ma* to 2*mc*, respectively; however, this is not limitative. Each of these may be attached to another member, so long as the geometric relationships of the beam center Cb, the reflective surface 4*fm* and the secondary reflective surface 5*fm*, relative to the mounting surface 2*ft*, are satisfied.

As described above, the semiconductor laser device 1 according to each of Embodiments, comprises: the stem 2 having the mounting surface 2*ft* which is located to be opposite to and spaced apart from an emission port (for example, lens 6); the semiconductor laser light source 3 which is disposed so as to have beam components whose beam center Cb is directed toward the mounting surface 2*ft*; the reflective surface 4*fm* for reflecting laser light incident from the semiconductor laser light source 3 toward the emission port (lens 6); and the secondary reflective surface 5*fm* for reflecting laser light incident from the semiconductor laser light source 3 toward the emission port (lens 6), which is continuous with an end portion of the reflective surface 4*fm* on its side nearer to the semiconductor laser light source 3;

wherein one of the reflective surface 4*fm* and the secondary reflective surface 5*fm* is constituted by a dielectric multi-layer film that is formed on a photodiode (PD chip 41) for measuring a light quantity of the laser light; and wherein, in a plane perpendicular to the mounting surface 2*ft* and including the beam center Cb, when an inclination angle of the beam center Cb relative to the mounting surface 2*ft* (direction D2) is defined as α, an inclination angle β of the reflective surface 4*fm* is set to a value obtained by subtraction of a value that is less than α, from 45 degrees, while an inclination angle γ of the secondary reflective surface 5*fm* is set to a value obtained by subtraction of a value that is more than α, from 45 degrees.

Accordingly, the maximum value of the incident angle decreases while the minimum value of the incident angle increases, so that dispersion in reflectance is reduced. Thus, it is possible to provide a semiconductor laser device 1 which can suppress degradation in communication quality and reduction in output of light.

In a particular aspect, the boundary (boundary angle Ab) between the reflective surface 4*fm* and the secondary reflective surface 5*fm* is set at a location farther from the semiconductor laser light source 3 than a foot of a perpendicular line that is drawn from the emitting point 3*s* of the semiconductor laser light source 3 to a plane of the reflective surface 4*fm*. Thus, it is possible to surely reflect the laser light incident on the reflective surface 4*fm*, toward the lens 6.

When the inclination angle β is set to 45−α/2 degrees and a spread angle of the laser light from the beam center Cb is defined as θ, the boundary between the reflective surface 4*fm* and the secondary reflective surface 5*fm* is set at a position where a beam is incident whose inclination angle (boundary angle Ab) relative to the beam center Cb and toward the mounting surface 2*ft* is θ+γ+α/2−45 degrees. This makes it possible to match the minimum value of the incident angle on the reflective surface 4*fm* with the minimum value of the incident angle on the secondary reflective surface 5*ft*, to thereby surely reduce the difference in incident angle. Thus, dispersion in reflectance can be further reduced, to thereby surely prevent degradation in communication quality.

At the same time, when the inclination angle γ is set to 45−(α+θ)/2 degrees, it is possible to cause beams directed to the side of the beam center Cb nearer to the lens 6, and other beams spreading from the beam center Cb to the angle of θ/2, to be incident on the reflective surface 4*fm*. Thus, it is possible to accurately monitor the quantity of light beams while keeping the rate of beams directed to the PD chip 41. In particular, when the reflective surface 4*fm* is established by the PD chip 41, the light in the angular range of three-fourth the beam spread angle can be monitored by the PD chip 41.

At the same time, when the other one of the reflective surface 4*fm* and the secondary reflective surface 5*fm* is also constituted by a dielectric multi-layer film that is formed on a photodiode (the PD chip 41 or the PD chip 51), it is possible to monitor the light in all over the region of the beam spread angle, by using the PD chip 41 and the PD chip 51.

When the other one (corresponding to the secondary reflection portion 5) of the reflective surface 4*fm* and the secondary reflective surface 5*fm* is established by the reflection member 53 based on a refractive index difference, it can be fabricated at low cost by using a process similar to a semiconductor fabrication process.

When the secondary reflective surface 5*fm* is established in such a manner that a part of the stem 2 (an inclined surface of the inclined rest 2*mc*) is finished into a mirror surface, it is possible to achieve cost reduction. Furthermore, since attention shall be paid only to the minimum value of the incident angle on the reflective surface 4*fm*, the design flexibility is improved.

When the reflective surface 4*fm* and the secondary reflective surface 5*fm* are each located to be symmetrical by itself (the right reflective surface 4*fm*$_R$ and the left reflective surface 4*fm*$_L$, and the right secondary reflective surface 5*fm*$_R$ and the left secondary reflective surface 5*fm*$_L$) about the plane perpendicular to the mounting surface 2*ft* and including the beam center Cb, as a symmetry plane, and they are each inclined so as to become more distant from the mounting surface 2*ft* as it goes away from the symmetry plane, it is possible to suppress the laser light after being incident from the semiconductor laser light source 3, from spreading along the plane parallel to the mounting surface 2*ft*. As a result, it is possible to reduce the rate of the laser light getting off the lens 6, to thereby suppress reduction in output of light.

DESCRIPTION OF REFERENCE NUMERALS AND SIGNS

1: semiconductor laser device, 2: stem, 2*ft*: mounting surface, 3: semiconductor laser light source, 3*fe*: front-end face, 3*s*: emitting point, 4: reflection portion, 41: PD chip, 4*fm*: reflective surface, 5: secondary reflective surface, 51: PD chip, 53: reflection member, 5*fm*: secondary reflective surface, 6: lens, Ab: boundary angle, Cb: beam center, α: inclination angle, β: inclination angle, γ: inclination angle, θ: spread angle.

The invention claimed is:

1. A semiconductor laser device, comprising:
a stem having a mounting surface which is located to be opposite to and spaced apart from an emission port;
a semiconductor laser light source which is disposed so as to have beam components whose beam center is directed toward the mounting surface;
a reflective surface for reflecting laser light incident from the semiconductor laser light source toward the emission port; and
a secondary reflective surface for reflecting laser light incident from the semiconductor laser light source toward the emission port, which is continuous with an end portion of said reflective surface on its side nearer to the semiconductor laser light source;
wherein one of said reflective surface and said secondary reflective surface is constituted by a dielectric multi-layer film that is formed on a photodiode for measuring a light quantity of the laser light; and
wherein, in a plane perpendicular to the mounting surface and including the beam center, when an inclination angle of the beam center relative to the mounting surface is defined as α, an inclination angle β of said reflective surface is set to a value obtained by subtraction of a value that is less than α, from 45 degrees, while an inclination angle γ of said secondary reflective surface is set to a value obtained by subtraction of a value that is more than α, from 45 degrees.

2. The semiconductor laser device of claim 1, wherein a boundary between said reflective surface and said secondary reflective surface is set at a location farther from the semiconductor laser light source than a foot of a perpendicular line that is drawn from an emitting point of the semiconductor laser light source to a plane of said reflective surface.

3. The semiconductor laser device of claim 2, wherein when the inclination angle β is set to 45−α/2 degrees and a spread angle of the laser light from the beam center is defined as θ, a boundary between said reflective surface and said secondary reflective surface is set at a position where a beam is incident whose inclination angle Ab relative to the beam center and toward the mounting surface is θ+γ+α/2− 45 degrees.

4. The semiconductor laser device of claim 3, wherein the inclination angle γ is set to 45−(α+θ)/2 degrees.

5. The semiconductor laser device of claim 2, wherein the other one of said reflective surface and said secondary reflective surface is also constituted by a dielectric multi-layer film that is formed on a photodiode.

6. The semiconductor laser device of claim 2, wherein the other one of said reflective surface and said secondary reflective surface is established by a reflection member based on a refractive index difference.

7. The semiconductor laser device of claim 2, wherein said secondary reflective surface is established in such a manner that a part of the stem is finished into a mirror surface.

8. The semiconductor laser device of claim 2, wherein said reflective surface and said secondary reflective surface are each symmetrical about the plane perpendicular to the mounting surface and including the beam center, as a symmetry plane, and are each inclined so as to become more distant from the mounting surface as it goes away from the symmetry plane.

9. The semiconductor laser device of claim 1, wherein when the inclination angle β is set to 45−α/2 degrees and a spread angle of the laser light from the beam center is defined as θ, a boundary between said reflective surface and said secondary reflective surface is set at a position where a beam is incident whose inclination angle Ab relative to the beam center and toward the mounting surface is θ+γ+α/2− 45 degrees.

10. The semiconductor laser device of claim 9, wherein the inclination angle γ is set to 45−(α+θ)/2 degrees.

11. The semiconductor laser device of claim 10, wherein the other one of said reflective surface and said secondary reflective surface is also constituted by a dielectric multi-layer film that is formed on a photodiode.

12. The semiconductor laser device of claim 10, wherein the other one of said reflective surface and said secondary reflective surface is established by a reflection member based on a refractive index difference.

13. The semiconductor laser device of claim 10, wherein said reflective surface and said secondary reflective surface are each symmetrical by about the plane perpendicular to the mounting surface and including the beam center, as a symmetry plane, and are each inclined so as to become more distant from the mounting surface as it goes away from the symmetry plane.

14. The semiconductor laser device of claim 9, wherein the other one of said reflective surface and said secondary reflective surface is also constituted by a dielectric multi-layer film that is formed on a photodiode.

15. The semiconductor laser device of claim 9, wherein the other one of said reflective surface and said secondary reflective surface is established by a reflection member based on a refractive index difference.

16. The semiconductor laser device of claim 9, wherein said reflective surface and said secondary reflective surface are each symmetrical about the plane perpendicular to the mounting surface and including the beam center, as a symmetry plane, and are each inclined so as to become more distant from the mounting surface as it goes away from the symmetry plane.

17. The semiconductor laser device of claim 1, wherein the other one of said reflective surface and said secondary reflective surface is also constituted by a dielectric multi-layer film that is formed on a photodiode.

18. The semiconductor laser device of claim 1, wherein the other one of said reflective surface and said secondary reflective surface is established by a reflection member based on a refractive index difference.

19. The semiconductor laser device of claim 1, wherein said secondary reflective surface is established in such a manner that a part of the stem is finished into a mirror surface.

20. The semiconductor laser device of claim 1, wherein said reflective surface and said secondary reflective surface are each symmetrical about the plane perpendicular to the mounting surface and including the beam center, as a symmetry plane, and are each inclined so as to become more distant from the mounting surface as it goes away from the symmetry plane.

* * * * *